United States Patent
Sada et al.

(10) Patent No.: US 6,584,371 B1
(45) Date of Patent: Jun. 24, 2003

(54) METHOD AND APPARATUS FOR PROCESS CONTROL OF SEMICONDUCTOR DEVICE FABRICATION LINE

(75) Inventors: Toshihiro Sada, Tokyo (JP); Junji Orimoto, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/516,809

(22) Filed: Mar. 1, 2000

(30) Foreign Application Priority Data

Mar. 2, 1999 (JP) .......................................... 11-054831

(51) Int. Cl.[7] .............................. G06F 19/00; G06F 7/00
(52) U.S. Cl. ........................ 700/116; 700/115; 700/121; 700/215; 700/225
(58) Field of Search ................................ 700/115, 116, 700/121, 99, 100, 101, 107, 108, 215, 221, 224, 225

(56) References Cited

U.S. PATENT DOCUMENTS

| | | | |
|---|---|---|---|
| 5,375,062 A | 12/1994 | Aoki | 700/99 |
| 5,432,702 A * | 7/1995 | Barnett | 700/116 |
| 5,751,581 A * | 5/1998 | Tau et al. | 700/115 |
| 5,980,591 A * | 11/1999 | Akimoto et al. | 29/25.01 |
| 6,192,291 B1 * | 2/2001 | Kwon | 700/121 |
| 6,449,522 B1 * | 9/2002 | Conboy et al. | 700/121 |

FOREIGN PATENT DOCUMENTS

| | | | |
|---|---|---|---|
| JP | 03-265296 | 9/1991 | H01L/21/02 |
| JP | 5-109596 | 4/1993 | H01L/21/02 |
| JP | 10-11108 | 1/1998 | G05B/15/02 |
| KR | 1998-066945 | 10/1998 | H01L/21/66 |

* cited by examiner

Primary Examiner—Maria N. Von Buhr
Assistant Examiner—Ryan Jarrett
(74) Attorney, Agent, or Firm—Hayes Soloway P.C.

(57) ABSTRACT

A lot-base management host computer performs management of wafers with a lot as a unit by managing a process condition for each lot, a correspondence between a carrier ID and a lot ID, and a correspondence between a slot ID and a wafer ID in each lot. A wafer-base management host computer performs management for each wafer in a lot by managing a process condition corresponding to a wafer number in a lot. Further, a converted condition instructing section transmits data acquired from the lot-base management host computer and the wafer-base management host computer to a semiconductor fabrication apparatus. The wafer-base management host computer stores a process condition for each level and a machine number of a semiconductor fabrication apparatus in use in the form of a matrix as an experimental level master and issues a process condition as instructions to the semiconductor fabrication apparatus through the converted condition instructing section according to the experimental level master.

14 Claims, 8 Drawing Sheets

FIG. 3
(PRIOR ART)

| WAFER No. | 1 | 2 | 3 | 4 | 5 | ~ | 24 | 25 |
|---|---|---|---|---|---|---|---|---|
| STEP a | IIMP001 | IIMP001 | IIMP001 | IIMP001 | IIMP002 | ~ | IIMP001 | IIMP002 |

| WAFER No. | 1 | 2 | 3 | 4 | 5 | ~ | 24 | 25 |
|---|---|---|---|---|---|---|---|---|
| STEP b | DI10001 | DI10001 | DI20002 | DI20002 | DI20002 | ~ | LPH0010 | LPH0001 |

| WAFER No. | 1 | 2 | 3 | 4 | 5 | ~ | 24 | 25 |
|---|---|---|---|---|---|---|---|---|
| STEP c | LPH2001 | LPH2002 | LPH2004 | LPH2004 | LPH0004 | ~ | LPH2010 | LPH2010 |

| STEP a | | STEP b | | STEP c | |
|---|---|---|---|---|---|

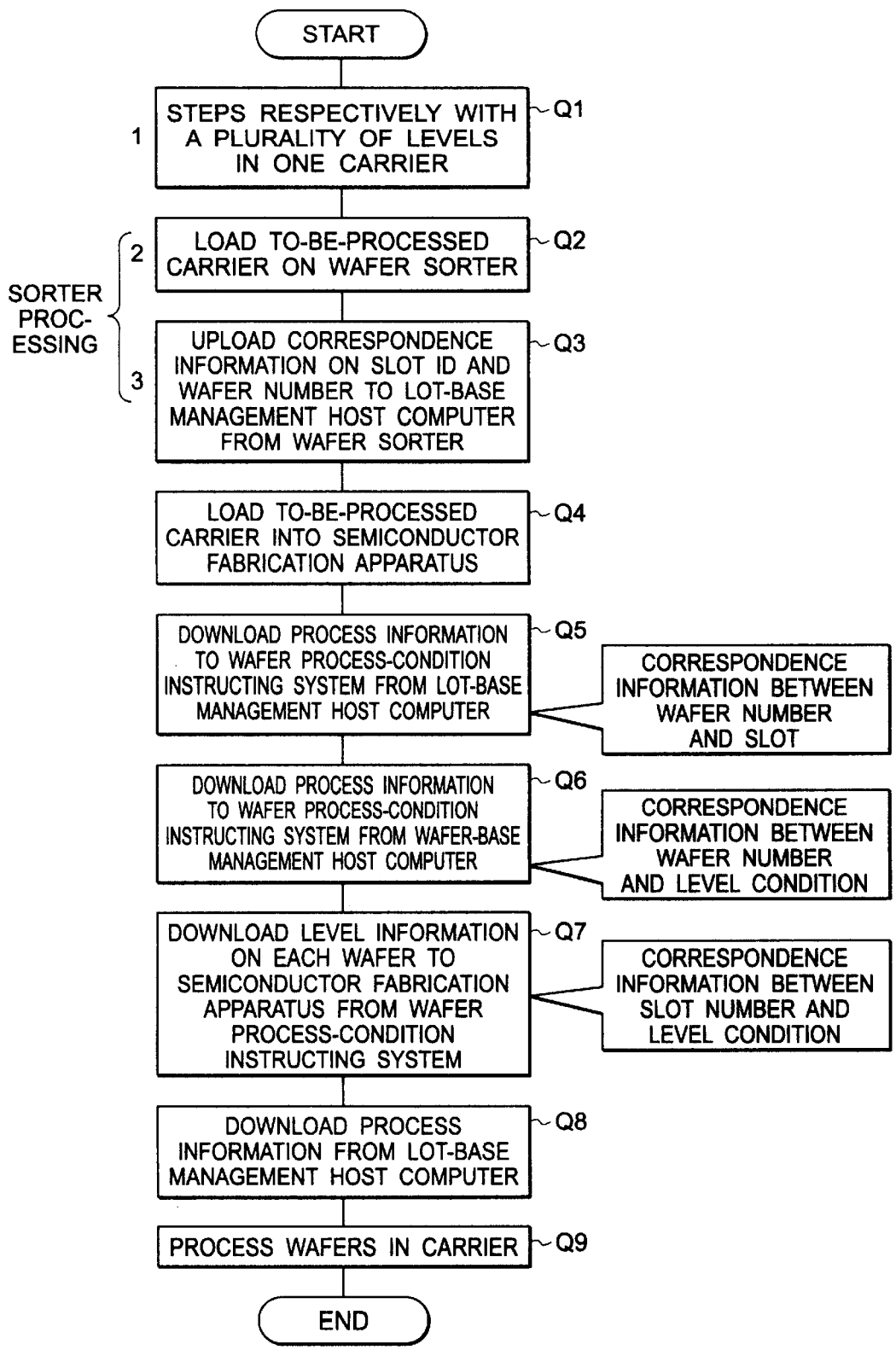

METHOD AND APPARATUS FOR PROCESS CONTROL OF SEMICONDUCTOR DEVICE FABRICATION LINE

BACKGROUND OF THE INVENTION

1. Technical Field

The present invention relates to a process control system that manages a plurality of semiconductor wafers as one lot, automatically issues instructions about process conditions to a fabrication facility (semiconductor fabrication apparatus) and further, collects measurement results, for example, from measuring instruments on-line. More particularly, the invention relates to a method and apparatus for process control of a semiconductor device fabrication line where input and correction of data for automatically setting levels (i.e., positions or priority levels) in a plurality of experimental steps are performed with ease.

2. Description of the Related Art

In a semiconductor device fabrication line, there has been adopted a process control system by which fabrication facilities are not specified for respective uses in fabrication of an "experimental device" (i.e., a prototype product) and in fabrication of a "mass fabrication device" (i.e., a product) in a fixed manner, but, instead, a fabrication schedule for an experimental device is incorporated in a fabrication schedule for a mass fabrication device, and thus, the fabrication facilities in a single line are flexibly shared for uses in fabrication of experimental devices and in fabrication of mass fabrication devices in a compatible manner (see, for example, JP-A 10-11108).

FIG. 1 is an illustration showing a conventional process management system of this kind in which mass fabrication devices and experimental devices are mixed. That is, a lot-base management host computer 1 is a host computer that performs management of wafers for each lot and manages process conditions for each lot, progress management for each lot, the correspondence between a carrier ID and a lot ID, and the correspondence between a slot ID and a wafer ID in each lot. Further, respective semiconductor device fabrication apparatuses 2 perform various processing such as etching, ion implantation, oxide film formation and others on wafers in a lot to be processed according to conditions provided from the lot-base management host computer.

In the case of a special operational step including an experimental device, wafers in a carrier are divided, such that a lot and a process condition are related in a one to one correspondence. In this case, a carrier in process is loaded into a semiconductor fabrication apparatus 2. The semiconductor fabrication apparatus 2 inquires of the lot-base management host computer 1 about lot information using the loaded carrier ID as a key. The lot-base management host computer 1 transmits a process condition corresponding to the lot to the semiconductor fabrication apparatus 2. The semiconductor fabrication apparatus 2 performs processing of wafers according to the instructed process conditions, thereby completing operations over the entire lot.

On the other hand, in the case where an operation step is "normal", i.e., only associated with a mass fabrication device, a carrier in process is first loaded into a semiconductor fabrication apparatus 2. The semiconductor fabrication apparatus 2 inquires of the lot-base management host computer 1 about lot information using a loaded carrier ID as a key. The lot-base management host computer 1 transmits process conditions corresponding to the lot to the semiconductor fabrication apparatus 2. The semiconductor fabrication apparatus 2 performs processing of wafers according to the instructed process conditions, thereby completing operations over the entire lot.

Further, FIG. 2 is a flow chart showing a conventional process control system. First, in a case where experimental steps with a plurality of levels (i.e., positions or priority levels) are included in one carrier (step S1), carriers are divided into groups with respective levels while confirming information from the lot-base management host computer 1 at a wafer sorter (step S2). That is, the wafers are rearranged into the carriers according to levels at the sorter based on data acquired from the lot-base management host computer 1, wherein wafers are divided into the carriers with respective levels, related in a one carrier to one level correspondence (step S3). After such a rearrangement, carriers to be processed are loaded into the semiconductor fabrication apparatuses (step S4). Then, processing information is downloaded on the semiconductor fabrication apparatuses 2 from the lot-base management host computer 1 (step S5) and processing of wafers in the carriers are performed in the semiconductor fabrication apparatus (step S6). Such processing is performed on all the carriers into which wafers are rearranged according to levels (step S7). Thereafter, information from the lot-base management host computer 1 is confirmed at the wafer sorter, wafers in the carriers are integrated into the respective levels, and each group of the wafers thus integrated is placed in one carrier when the wafers have been processed in the same condition (step S8).

FIG. 3 shows a conventional "master" (i.e., a master table database or other file) for experimental levels. In the processing corresponding to the master illustrated, a set of steps a, b and c is repeated in sequential order a plurality of times in a serial manner. In a conventional system, a master of experimental levels for a wafer number and each step is prepared, the master of experimental levels is stored in the lot-base management host computer, and instructions are issued to semiconductor fabrication apparatuses based on the master for experimental levels.

However, in such a conventional technique, since a host computer has only performed management of wafers for each lot, the host computer has not been able to issue a complicated process condition as instructions. Further, when there is a plurality of process conditions within one lot, the conventional technique has problematically had poor efficiency in aspects of lost productivity, time and transportation, since one lot has to be divided into groups of wafers according to process conditions, such that one condition corresponds to one lot.

The conventional technique has had further problems:

As shown in FIG. 3, in a conventional system, since process conditions for each wafer and specification data for measurement are dispersed over respective steps, the relationship between steps cannot be integrally grasped for each wafer. Therefore, since set data for a plurality of steps constituting an experiment cannot be displayed for each wafer, there arises a necessity to enter level data into respective steps, which not only makes grasping an overview of an experiment hard, but also makes entering data burdensome. Besides, since a comprehensive level that plays an auxiliary role in viewing the overview cannot be automatically calculated, input errors may be generated.

SUMMARY OF THE INVENTION

An object of the invention is to provide a method and apparatus for process control of a semiconductor device fabrication line by means of which experimental levels in a plurality of steps can be viewed at a given time, a process condition can be displayed for each wafer, and setting and management of experimental level data are performed with ease.

A first process control method for a semiconductor device fabrication line according to the present invention is a method for managing fabrication in a semiconductor fabrication line, using a lot-base management host computer that performs management for each lot by managing a process condition for each lot, a correspondence between a carrier ID and a lot ID, and a correspondence between a slot ID and a wafer ID in each lot; a wafer-base management host computer that performs management for each wafer in a lot by managing a process condition corresponding to a wafer number in a lot; and a converted condition instructing section that transmits data acquired from the lot-base management host computer and the wafer-base management host computer to a semiconductor fabrication apparatus. Said method comprises the following steps. Namely, the semiconductor fabrication apparatus inquires of the converted condition instructing section about lot information based on a carrier ID loaded thereinto. The converted condition instructing section acquires a process condition for the lot, slot ID information and wafer ID information from the lot-base management host computer, and in a case where wafers in process are experimental wafers, not only acquires information of each wafer in the lot from the wafer-base management host computer, but transmits a process condition corresponding to the slot ID to the semiconductor fabrication apparatus.

A second process control method for a semiconductor device fabrication line according to the present invention comprises the following steps. Namely, when the semiconductor fabrication apparatus inquires of the converted condition instructing section about lot information based on a carrier ID loaded thereinto, then the converted condition instructing section acquires a process condition for the lot, slot ID information and wafer ID information from the lot-base management host computer, and then, the converted condition instructing section, in a case where wafers in process are experimental wafers, not only acquires information of each wafer in the lot from the wafer-base management host computer, but transmits a process condition corresponding to the slot ID to the semiconductor fabrication apparatus.

A process control apparatus for a semiconductor device fabrication line according to the present invention comprises a lot-base management host computer that performs management for each lot by managing a process condition for each lot, a correspondence between a carrier ID and a lot ID, and a correspondence between a slot ID and a wafer ID in each lot; a wafer-base management host computer that performs management for each wafer in a lot by managing a process condition corresponding to a wafer number in a lot; and a converted condition instructing section that transmits data acquired from the lot-base management host computer and the wafer-base host computer to a semiconductor fabrication apparatus. The wafer-base management host computer stores process conditions for respective levels and machine numbers of semiconductor fabrication apparatuses in use in the form of a matrix using experimental steps and wafer numbers as a master for experimental levels and issues a process condition to the semiconductor fabrication apparatus through the converted condition instructing section according to the master for experimental levels.

The process control apparatus for a semiconductor device fabrication line according to the present invention may have a sorter that reads the ID of a wafer inserted in a slot of a carrier and transmits a slot ID and the wafer ID to the lot-base management host computer, or a sorter that reads the ID of a wafer inserted in a slot of a carrier, transmits a result of the reading to the lot-base management host computer and, when a correspondence between the slot ID and the wafer ID does not coincide with a correspondence therebetween that is stored in the lot-base management host computer, transfers the wafer to a correct lot.

Further, the master for experimental levels can include a control characteristic specification for each wafer in addition to a process condition. Still further, the present invention can comprise a display unit for displaying the master for experimental levels; and a correcting unit for correcting the contents of the master in display. Yet further, the present invention can comprise a display unit for determining and displaying the number of comprehensive levels as results of assigning levels in a plurality of experimental steps.

BRIEF DESCRIPTION OF DRAWINGS

FIG. 3 shows an illustration of a conventional master (i.e., master database, table or file) for experimental levels;

FIG. 8 is a flow chart showing operations in the embodiments.

BRIEF DESCRIPTION OF THE PREFERRED EMBODIMENTS

Figure 1:
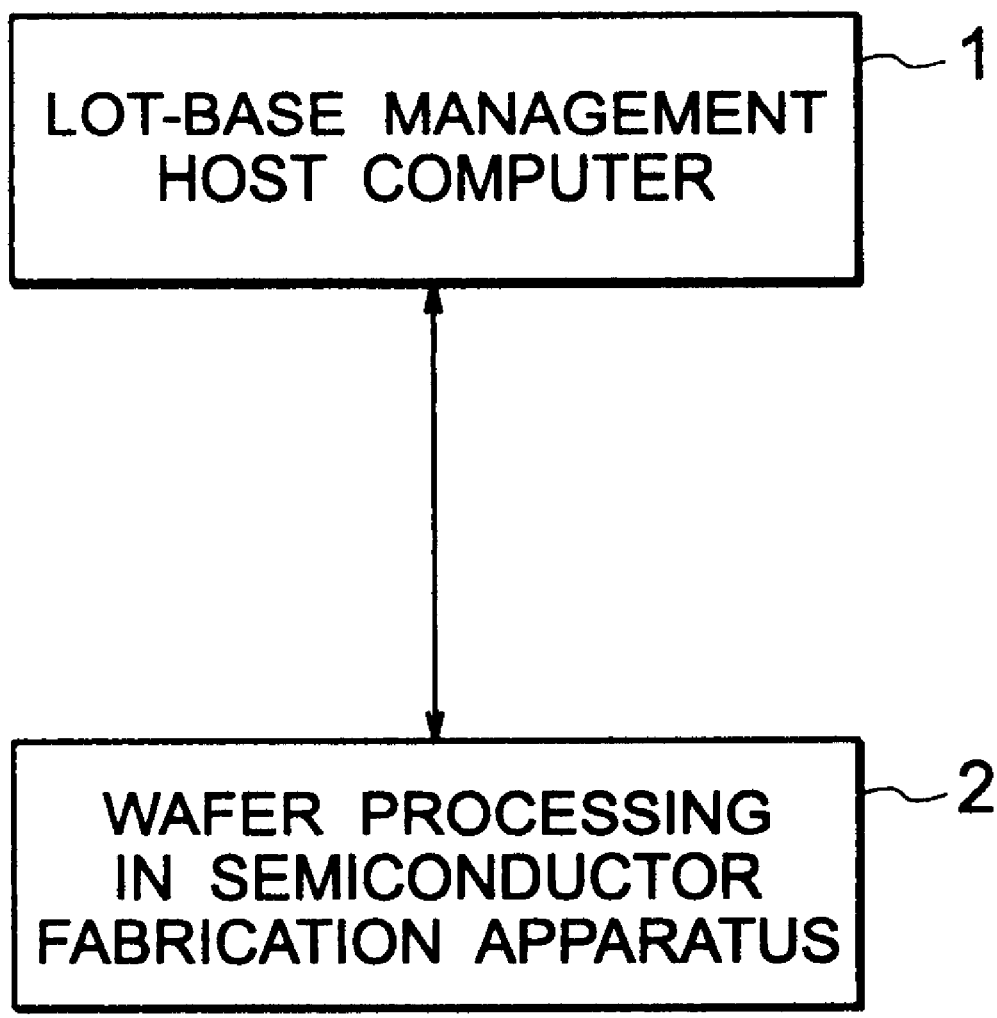
FIG. 1 is a block diagram showing a conventional process control system.
Figure 2:
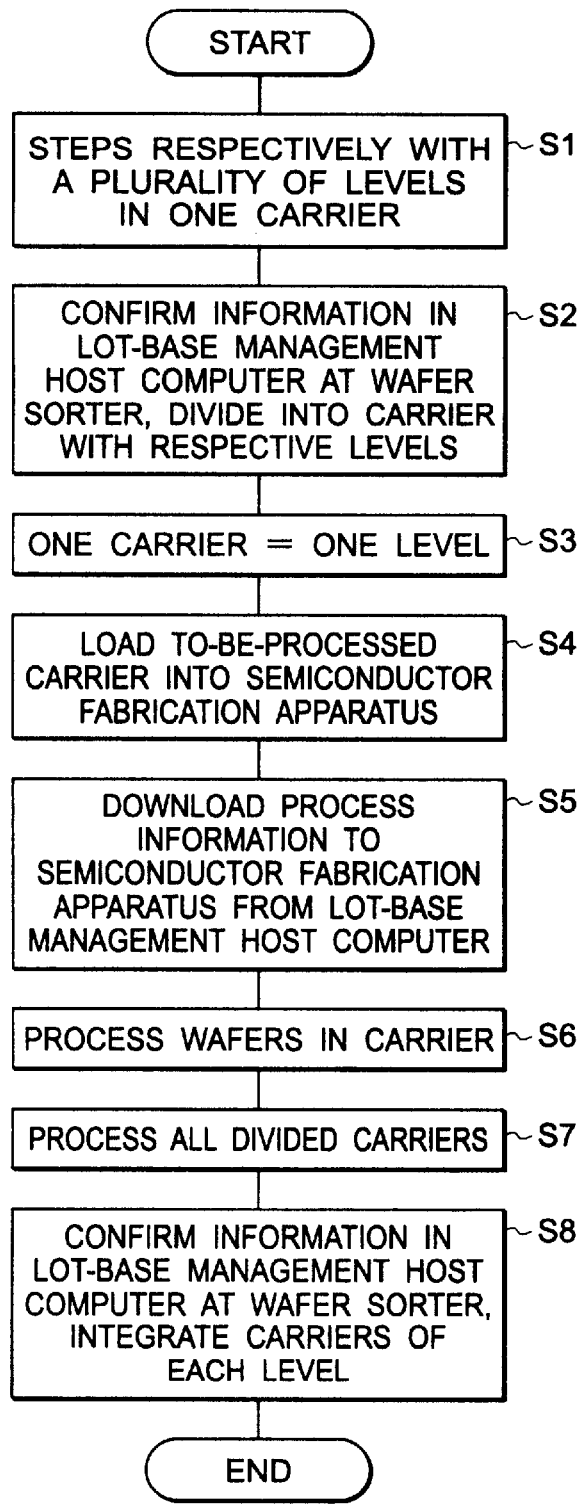
FIG. 2 is a flow chart showing operations of the conventional process control system.
Figure 4:
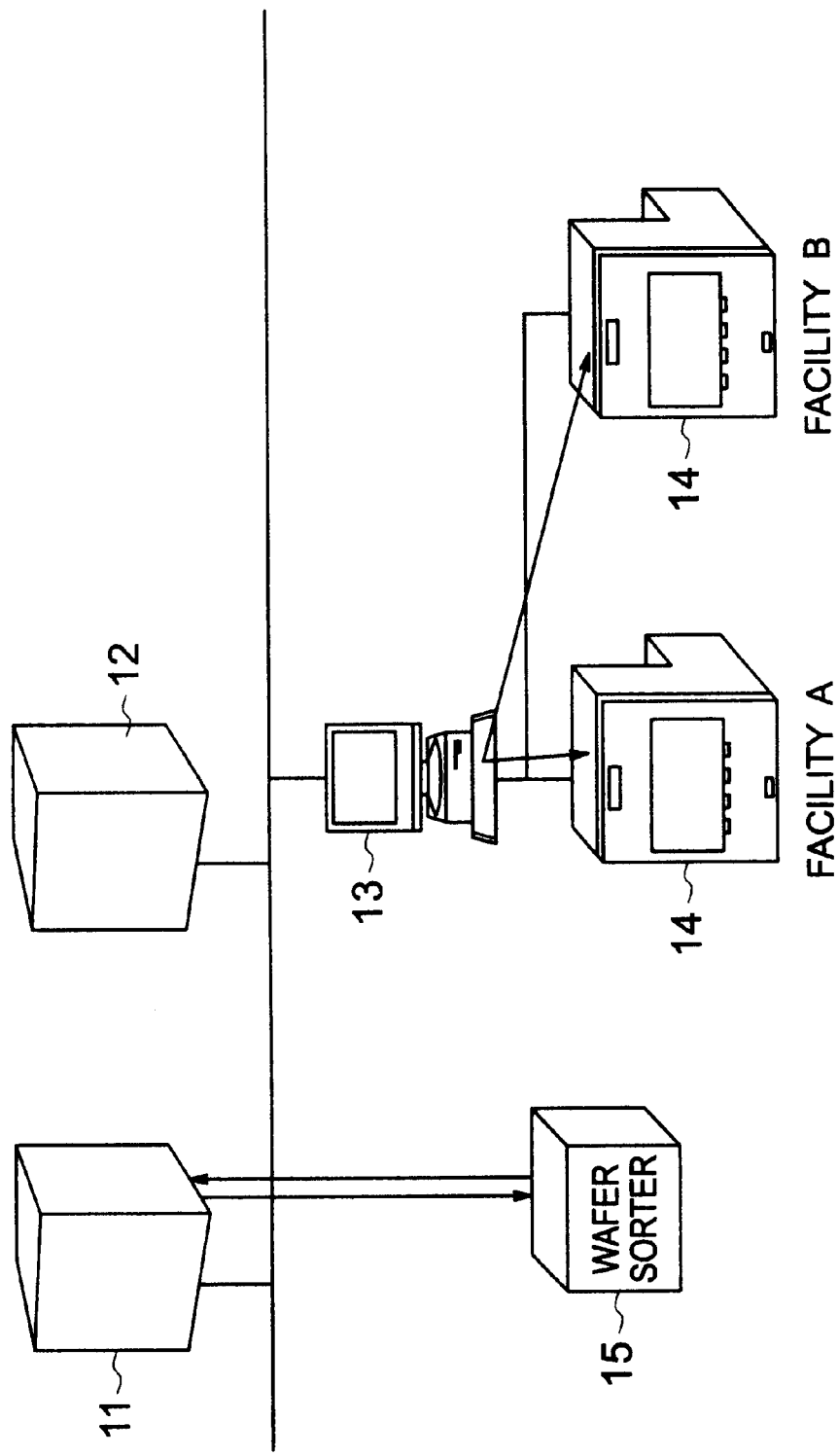
FIG. 4 is a block diagram showing a process control system for a semiconductor device fabrication line according to a first embodiment of the invention.

Embodiments of the invention will be described in detail with reference to the accompanying drawings. FIG. 4 is a block diagram showing a process control system according to an embodiment of the invention. The present invention comprises, as a technical feature, a converted condition instructing section 13 that transmits, to a semiconductor fabrication apparatus, a process condition for the ID of each slot obtained by conversion of a process condition issued for the ID of each wafer in a lot to be processed; and a wafer-base management host computer 12 that manages information on a wafer by wafer basis. That is, in FIG. 4, a lot-base management computer 11 manages a process condition for each lot, progress management for each lot, the correspondence between a carrier ID and a lot ID, the correspondence between a slot ID and a wafer ID (wafer number) in each lot, etc. The wafer-base management host computer 12 manages a process condition, etc., corresponding to a wafer number in a lot. Further, a converted condition instructing section 13 performs communications between the lot-base management host computer 11, the wafer-base management host computer 12 and semiconductor fabrication apparatus 14, conversion of information, etc. Each semiconductor fabrication apparatus 14 processes a lot of wafers according to instructions from the converted condition instructing section 13. A wafer sorter 15 reads the ID of a wafer inserted in the slot of a carrier and transmits, to the lot-base management host computer 11, the ID of the wafer together with information on the correspondence with the ID of the slot. It is another possibility that the wafer sorter 15 reads the ID of a wafer and, when the correspondence of the ID of the wafer and the ID of the slot in which the wafer is inserted is different from the correspondence of the ID of the wafer and the ID of the slot provided from the lot-base management host computer I 1, the wafer sorter takes out the wafer from the slot and reinserts the wafer into the correct slot.

Next, description will be made of operations of the system of the embodiment constructed as described above. First, a carrier in process is loaded into the semiconductor fabrication apparatus 14. The semiconductor fabrication apparatus 14 inquires of the converted condition instructing section 13 about lot information with the ID of a carrier that has been loaded as a key. The converted condition instructing section 13 acquires the lot information, process condition, etc., from the lot-base management host computer 11. In this stage, if a step in process is of a special operation, as in a case of an experimental lot, the converted condition instructing section 13 acquires information on each wafer in the lot from the wafer-base management host computer 12. The converted condition instructing section 13 further acquires slot ID information and wafer ID information of the lot from the lot-base management host computer 11. After completion of a series of operations as described above, the converted condition instructing section 13 transmits a process condition corresponding to the slot ID to the semiconductor fabrication apparatus 14. The semiconductor fabrication apparatus 14 progresses with the wafer processing according to an instructed process condition, thus completing operations for the entire lot.

On the other hand, in a case where wafers to be processed are to be used for mass fabrication devices and therefore, operational steps are of a normal type, when a carrier in process is loaded into the semiconductor fabrication apparatus 14, the semiconductor fabrication apparatus 14 inquires of the converted condition instructing section 13 about lot information with the carrier ID as a key. The converted condition instructing section 13 acquires the information on and process condition for the lot, etc., from the lot-base management host computer 1 1. The converted condition instructing section 13 transmits a processing condition corresponding to the lot to the semiconductor fabrication apparatus 14. The semiconductor fabrication apparatus 14 progresses with the wafer processing according to an instructed process condition, thus completing operations of all of the lot.

In the embodiment described above, the correspondence data between a slot ID and a wafer ID in a to-be-processed lot is stored in the lot-base management host computer 11 in advance, an instruction of a process condition corresponding to a wafer ID is converted to a condition instruction for a slot ID at the converted condition instructing section 13 based on the correspondence data, and the converted condition instructing section 13 issues condition instructions to the semiconductor fabrication apparatus 14.

Most semiconductor fabrication apparatuses 14 have no wafer recognition function, and when information on a wafer ID and information on a slot ID are different from each other, a wafer that has been processed is useless, even when a condition is instructed according to a wafer ID, since the semiconductor fabrication apparatus 14 can perform processing only in response to instructions for a slot ID. Therefore, conversion is effected from a process condition for a wafer ID to a process condition for a slot ID, a converted process condition is transmitted to the semiconductor fabrication apparatus 14, and thereby, a wafer is processed according to the same process condition as a process condition for the wafer ID. In such a manner, in this embodiment, instructions of a process condition for each wafer can be issued. Further, even when a semiconductor fabrication apparatus 14 does not recognize a wafer, a process condition corresponding to a wafer ID can be issued to the semiconductor fabrication apparatus 14.

In addition, the lot-base management host computer 11 can control a process condition for a lot to-be-processed on a one to one correspondence basis only. Therefore, the lot would have to be divided into groups of wafers such that wafers in each group have the same process condition; however, in this embodiment, since a plurality of process conditions can be instructed at a time, division of the lot into groups is not necessary. That is, it is not necessary for additional new lots to be created, leading to higher transportation efficiency.

Figure 5:
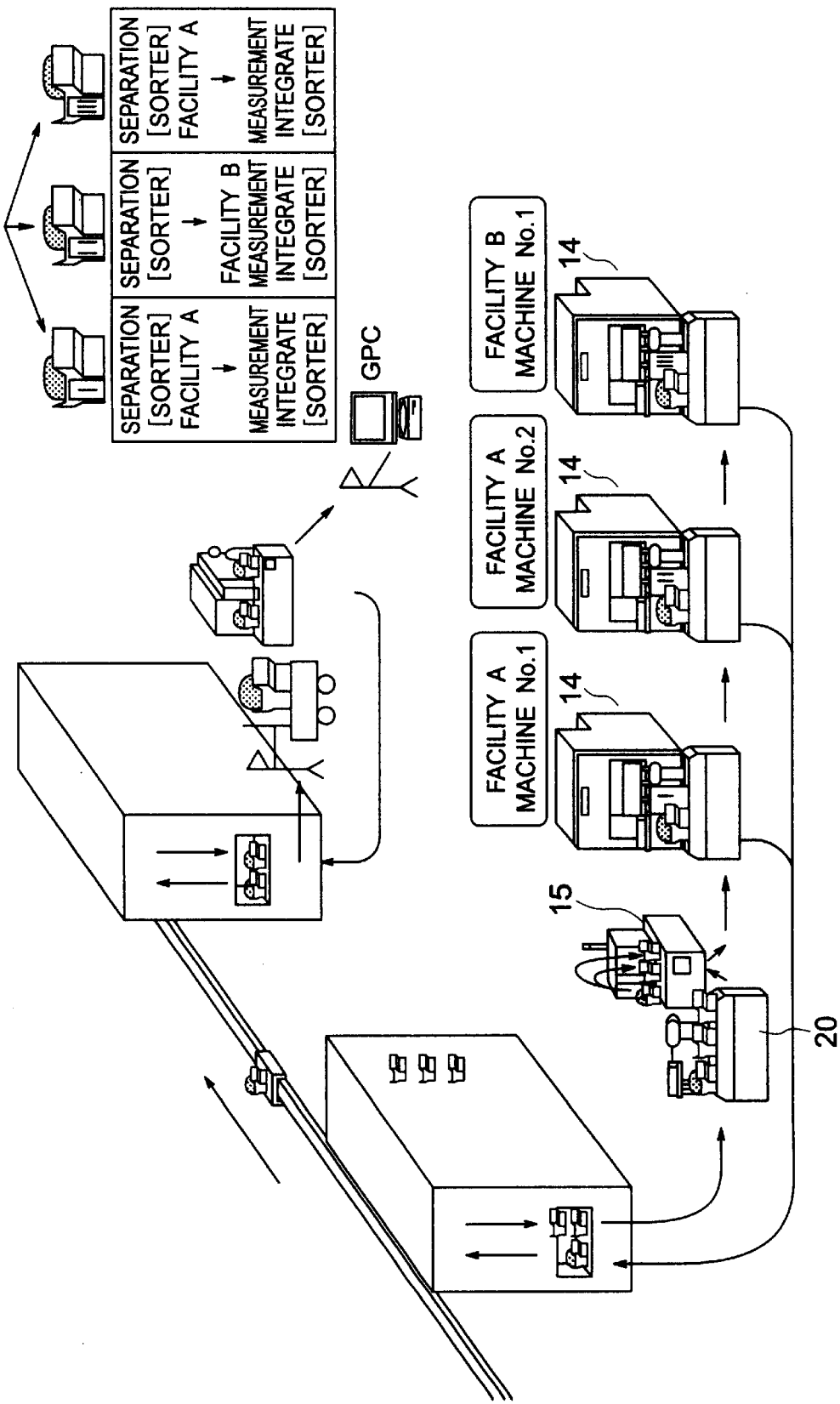
FIG. 5 is a pictorial illustration showing operations to assign machine numbers to respective apparatuses of a process control system for a semiconductor device fabrication line according to a second embodiment of the invention.
Figure 6:
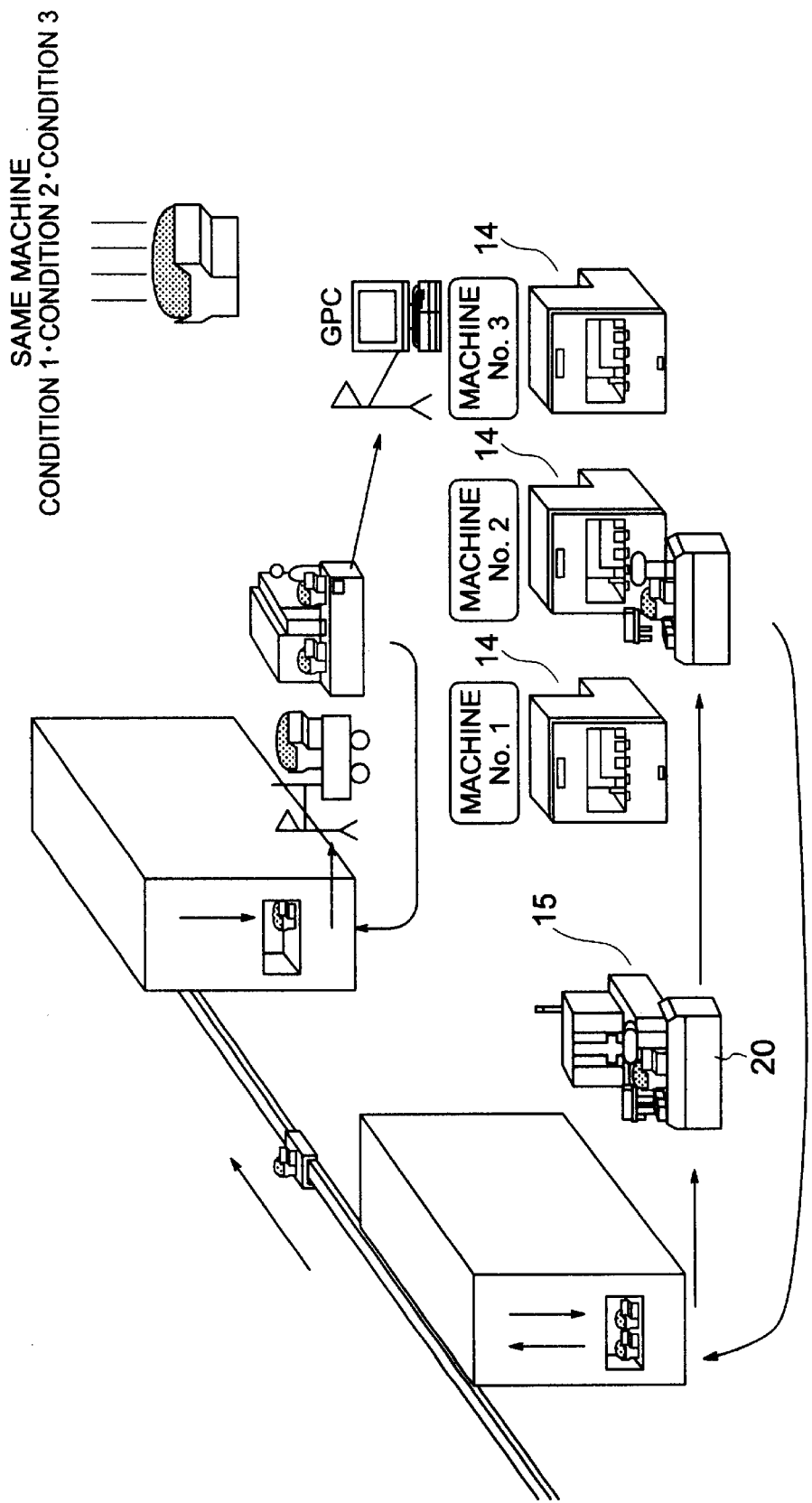
FIG. 6 is a pictorial illustration showing operations to assign conditions to respective apparatuses of a process control system for a semiconductor device fabrication line according to the second embodiment of the invention.
Figure 7:
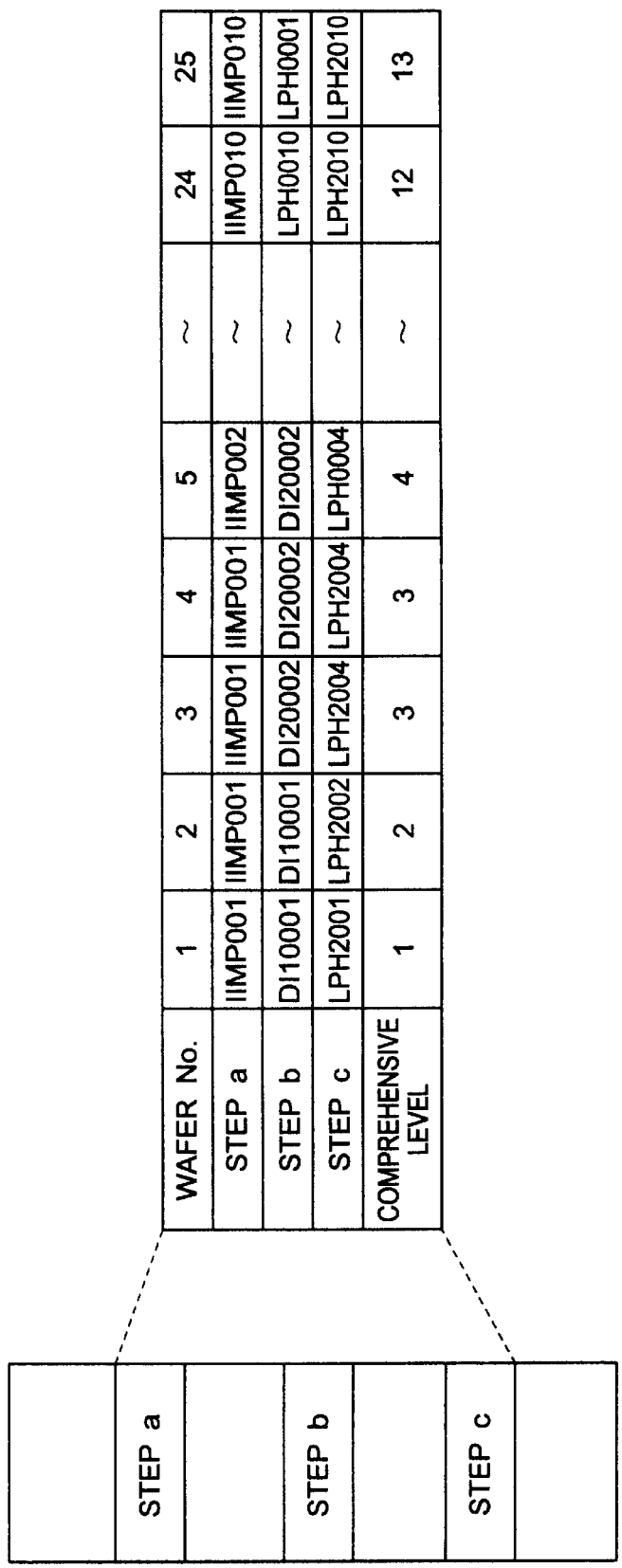
FIG. 7 is a tabular illustration showing a master for experimental levels in the second embodiment.

Next, a second embodiment of the invention will be described. FIGS. 5 to 7 are representations showing an automatic experimental system of this embodiment; FIG. 5 shows a way to assign machine numbers to carriers; FIG. 6 is a schematic pictorial illustration of operations to assign process conditions to respective carriers; and FIG. 7 is a schematic illustration showing a master for assigning levels (i.e., positions or priority levels) in this embodiment.

The process control system of the embodiment shown in FIGS. 5 and 6 controls a plurality of semiconductor wafers in lots, automatically issues process conditions to fabrication facilities and collects measurement results from measuring instruments on-line. In this embodiment, data for automatically assigning process conditions in a plurality of experimental steps is entered with ease.

The lot-base management host computer (not shown in FIGS. 5 and 6) comprises: a progress management section in which a progress status of each lot is memorized; a step procedure master showing the order of steps of each lot and whether or not a step is experimental; an experimental level master showing process conditions for respective levels in the form of a matrix using steps (experimental steps) with respective levels and wafer numbers; and an input terminal (not shown) for entering, displaying and updating data of the experimental level master.

In FIGS. 5 and 6, the wafer sorter 15 takes out a single wafer 1 that is inserted in one of the slots of a carrier 20, which is transported from the slot, whereby a bar code on the wafer is read with a camera in order to recognize which slot each wafer is inserted in, and after the reading, the water 1 is reinserted to the original slot. The wafer sorter 15 transmits the correspondence between the wafer ID and the slot ID, if both are recognized, to the lot-base management host computer, or alternatively, when the wafer sorter 15 recognizes that a wafer taken out is inserted in an incorrect slot based on the correspondence between a wafer ID and a slot ID acquired from the lot-base management host computer, the wafer sorter 15 raises an alarm and the wafer 1 that has been inserted in the wrong slot is manually transferred to the correct slot.

An experimental level master shown in FIG. 7 is stored in the lot-base management host computer. An experimental level master, on which the combination of steps a, b, c, etc., is assigned to each wafer, is described in correspondence to a wafer number, and the master on which a wafer number and a process condition in each step are held in the form of a matrix is stored in the lot-base management host computer. In the experimental level master, the same level (i.e., position or priority level) is displayed in a case of a combination of the same step and the same process condition. Therefore, in the example shown in FIG. 7, 25 wafers are processed, whereby, for example, a wafer number 3 and a wafer number 4 receive the same processing in the same step, and, to be detailed, the process of a level 3 is applied to both wafer numbers 3 and 4. In such a manner, since there is a plurality of wafers with the same levels, the number of patterns amounts to 13 kinds.

In the experimental level master, contents of processing displayed in a step a is of a step of ion implantation indicated by IIMP, and DI and LPH indicate a diffusion step and a low pressure CVD (LPCVD) step in the processing of steps b and c. A sequence of figures following an alphabetical symbol indicates a detailed process condition.

A display that displays the experimental level master and an input device though which data is entered or corrected are connected to the wafer-base management host computer. Further, wafers whose process conditions in steps a, b and c are the same are selected as being at the same level on the lot-base management host computer, and, in turn, the same level is displayed on the display as a comprehensive level.

In the process control system of this embodiment, the current step of a lot is determined by a progress control section of the lot-base management host computer and judgment is effected on whether the current step is an experimental step or a normal step, in which processing of a mass fabrication device is effected based on a step procedure master and information on the current step of the lot. Furthermore, in the case of a normal step, a process condition is instructed to the semiconductor fabrication apparatus 14 such that the lot is processed according to the process condition indicated by the step procedure.

On the other hand, in the case of an experimental step, the experimental level master (shown in FIG. 7) is retrieved using the ID of a level table described in the step of the step procedure, and a step name in the level table as keys and process conditions for respective wafers are issued as instructions to the semiconductor fabrication apparatus 14 according to the contents of the results of retrieval. Alternatively, the wafer sorter and a carrier transportation system for a carrier are instructed such that the lot is separated prior to the experimental step at the wafer sorter, and after separation of the lot, instructions are issued to the semiconductor fabrication apparatuses 14 such that separate processing is performed in a plurality of apparatuses that have different machine numbers. In this case, the transportation system and the wafer sorter are again instructed such that the wafer sorter 15 is automatically synthesized back to the original lot after completion of the experiment at the wafer sorter 15.

As described above, in this embodiment, the experimental level master is displayed in the form of a table on the input terminal. In the display, level numbers of respective wafers are automatically calculated and presented after determining which levels are assigned on each respective wafer in a given lot as a result of level assignment in a plurality of steps. With this display, an operator in an input operation can view the relationships between experimental steps, and input of the experimental level master and a correcting (updating) operation can be effected with great ease. In particular, when not only a process condition but also a control characteristic specification are entered in an experimental level master, a control characteristic specification corresponding to a given level can be set. In this case, the input of a process condition in a step of a fabrication facility and the input of a management characteristic in a step for a measuring instrument corresponding to each wafer can be effected with ease. When an operator in an input operation corrects the experimental level master on the input terminal, the result of the correction is reflected on a table presented on the display connected to the lot-base management host computer. Further, when the operator pushes a confirmation button after confirmation of the contents of the table, the data of the table are outputted to the lot-base management host computer to update the experimental level master.

In this embodiment, in the experimental level master, process conditions for respective levels are described in the form of a matrix using an experimental step and a wafer number. Further, the experimental level master is displayed in the form of a table on the input device. For these reasons, experimental levels in a plurality of steps can be viewed at a single glance, thereby facilitating the setting and control of experimental data.

Operations as described above will be explained with reference to the flow chart shown in FIG. 8. Initially, wafers in a carrier have respective steps with a plurality of levels, and the steps are experimental (step Q1). A carrier to be processed is loaded on a wafer sorter 15 (step Q2), and the wafer sorter 15 reads slot IDs and wafer numbers in a corresponding manner. After the reading, the wafer sorter 15 uploads information to the lot-base management host computer 11, on the correspondence between the slot IDs and the wafer numbers (step Q3).

Following the upload, the carrier to be processed is loaded into the semiconductor fabrication apparatus 14 (step Q4). After the loading, processing information (on the correspondence between wafer numbers and slot IDs) is downloaded from the lot-base management host computer 11 into the converted condition instructing section 13 (step Q5). Further, processing information (on the correspondence between wafer numbers and level conditions) is downloaded from the wafer-base management host computer 12 into the converted condition instructing section 13 (step Q6). Subsequent to the downloading, level information of each wafer, stored as a wafer process condition (information on the correspondence between slot IDs and level conditions), is downloaded from the converted condition instructing section 13 into the semiconductor fabrication apparatus 14 (step Q7), and process information is downloaded from the lot-base management host computer (step Q8). Thereafter, the wafers in the carriers receive predetermined processing in the respective semiconductor fabrication apparatuses (step Q9).

As described above, the display of process conditions for respective wafers can be effected, and a process condition corresponding to the ID of a wafer can further be instructed, without confirmation of the process condition in a semiconductor fabrication apparatus. Furthermore, according to the invention, since a plurality of instructions can be effected, division of a lot is not necessary, thereby increasing transportation efficiency. In addition, when an experimental level master is provided in the invention, experimental levels in a plurality of steps can be viewed on one screen, which makes it very easy to set and manage experimental level data.

What is claimed is:

1. A process control method for a semiconductor device fabrication line, using a lot-base management host computer that performs management for each lot by managing a process condition for each lot, a correspondence between a carrier ID and a lot ID, and a correspondence between a slot ID and a wafer ID in each lot; a wafer-base management host computer that performs management for each wafer in a lot by managing a process condition corresponding to a wafer number in a lot; and a converted condition instructing section that transmits data acquired from the lot-base management host computer and the wafer-base management host computer to a semiconductor fabrication apparatus, said method comprising the steps of:

inquiring to the converted condition instructing section about lot information based on the ID of a carrier loaded into the semiconductor fabrication apparatus; and acquiring from the converted condition instructing section a process condition for the lot, slot ID information and wafer ID information from the lot-base management host computer, and in a case where wafers in process are experimental wafers, not only acquiring information of each wafer in the lot from the wafer-base management host computer, but also transmitting a process condition corresponding to the slot ID to the semiconductor fabrication apparatus.

2. A process control method for a semiconductor device fabrication line, using a lot-base management host computer that performs management for each lot by managing a process condition for each lot, a correspondence between a carrier ID and a lot ID, and a correspondence between a slot ID and a wafer ID in each lot; a wafer-base management host computer that performs management for each wafer in a lot by managing a process condition corresponding to a wafer number in a lot; and a converted condition instructing section that transmits data acquired from the lot-base management host computer and the wafer-base management host computer to a semiconductor fabrication apparatus, said method comprising the steps of:

acquiring at the converted condition instructing section a process condition for the lot, slot ID information and wafer ID information from the lot-base management host computer, when the semiconductor fabrication apparatus inquires to the converted condition instructing section about lot information based on the ID of a carrier loaded thereinto; and acquiring at the converted condition instructing section, in a case where wafers in process are experimental wafers, information of each wafer in the lot from the wafer-base management host computer; and transmitting a process condition corresponding to the slot ID to the semiconductor fabrication apparatus.

3. A process control apparatus for a semiconductor device fabrication line comprising:

a lot-base management host computer that performs management for each lot by managing a process condition for each lot, a correspondence between a carrier ID and a lot ID, and a correspondence between a slot ID and a wafer ID in each lot; and a wafer-base management host computer that performs management for each wafer in a lot by managing a process condition corresponding to a wafer number in the lot; and a converted condition instructing section that transmits data acquired from the lot-base management host computer and the wafer-base host computer to a semiconductor fabrication apparatus;

wherein the lot-base management host computer stores process conditions for respective levels and machine numbers of semiconductor fabrication apparatuses in use in the form of a matrix using experimental steps and wafer numbers as a master for experimental levels and issues a process condition to the semiconductor fabrication apparatus through the converted condition instructing section according to the master for experimental levels.

4. A process control apparatus for a semiconductor device fabrication line according to claim 3, further comprising:

a sorter that reads the ID of a wafer inserted in a slot of a carrier and transmits a slot ID and the wafer ID to the lot-base management host computer.

5. A process control apparatus for a semiconductor device fabrication line according to claim 3, further comprising:

a sorter that reads the ID of a wafer inserted in a slot of a carrier, transmits a result of the reading to the lot-base management host computer and, when a correspondence between the slot ID and the wafer ID does not coincide with a correspondence therebetween that is stored in the lot-base management host computer, transfers the wafer to a correct lot.

6. A process control apparatus for a semiconductor device fabrication line according to claim 3, wherein the master for experimental levels includes a control characteristic specification for at least one said wafer in addition to a process condition, said control characteristic specification being a management characteristic in a step for a measuring instrument, and control characteristic specification corresponding to at least one of said levels.

7. A process control apparatus for a semiconductor device fabrication line according to claim 4, wherein the master for experimental levels includes a control characteristic specification for at least one said wafer in addition to a process condition, said control characteristic specification being a management characteristic in a step for a measuring instrument, and control characteristic specification corresponding to at least one of said levels.

8. A process control apparatus for a semiconductor device fabrication line according to claim 5, wherein the master for experimental levels includes a control characteristic specification for at least one said wafer in addition to a process condition, said control characteristic specification being a management characteristic in a step for a measuring instrument, and control characteristic specification corresponding to at least one of said levels.

9. A process control apparatus for a semiconductor device fabrication line according to claim 3, further comprising:

a display unit for displaying the master for experimental levels; and a correcting unit for correcting the contents of the master in display.

10. A process control apparatus for a semiconductor device fabrication line according to claim 4, further comprising:

a display unit for displaying the master for experimental levels; and a correcting unit for correcting the contents of the master in display.

11. A process control apparatus for a semiconductor device fabrication line according to claim 5, further comprising:

a display unit for displaying the master for experimental levels; and a correcting unit for correcting the contents of the master in display.

12. A process control apparatus for a semiconductor device fabrication line according to claim 3, further comprising:

a display unit for determining and displaying the number of comprehensive levels based on the results of assigning levels in a plurality of experimental steps.

13. A process control apparatus for a semiconductor device fabrication line according to claim 4, further comprising:

a display unit for determining and displaying the number of comprehensive levels based on the results of assigning levels in a plurality of experimental steps.

14. A process control apparatus for a semiconductor device fabrication line according to claim 5, further comprising:

a display unit for determining and displaying the number of comprehensive levels based on the results of assigning levels in a plurality of experimental steps.

\* \* \* \* \*